United States Patent
Moriya et al.

(10) Patent No.: US 6,858,497 B2
(45) Date of Patent: Feb. 22, 2005

(54) NON-VOLATILE SEMICONDUCTOR MEMORY DEVICE AND A METHOD OF PRODUCING THE SAME

(75) Inventors: Hiroyuki Moriya, Kanagawa (JP); Toshio Kobayashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/922,141

(22) Filed: Aug. 19, 2004

(65) Prior Publication Data

US 2005/0020013 A1 Jan. 27, 2005

Related U.S. Application Data

(62) Division of application No. 10/168,921, filed as application No. PCT/JP01/09390 on Oct. 25, 2001, now Pat. No. 6,803,620.

(30) Foreign Application Priority Data

Oct. 27, 2000 (JP) .................................... P2000-328127
Apr. 4, 2001 (JP) .................................... P2001-106309

(51) Int. Cl.⁷ ............................................ H01L 21/336
(52) U.S. Cl. ..................... 438/262; 438/261; 438/266; 438/289; 438/591; 438/595; 257/298; 257/314; 257/316; 257/908
(58) Field of Search ........................... 438/3, 128–130, 438/201, 211, 216, 217, 241, 257, 260–266, 276, 278, 289, 290, 591–594

(56) References Cited

U.S. PATENT DOCUMENTS 5,654,568 A * 8/1997 Nakao ......................... 257/324
6,069,382 A * 5/2000 Rahim ......................... 257/316

FOREIGN PATENT DOCUMENTS

| JP | 62-291970 | 12/1908 |
| JP | 5-190863 | 6/2001 |
| JP | 2001-156188 | 6/2001 |

OTHER PUBLICATIONS

"Twin MONOS Cell With Dual Control Gates", Hayashi, Y. et al.; 2000 Symposium on VLSI Technology Digest of Technical Papers, Jun. 2000; pp. 122–123.

* cited by examiner

Primary Examiner—David Nelms
Assistant Examiner—Andy Huynh
(74) Attorney, Agent, or Firm—Sonnenschein, Nath & Rosenthal LLP

(57) ABSTRACT

The present invention prevents production of residue which causes short-circuit between word lines. A memory cell comprises a channel formation region CH, charge storage films CSF each comprised of a plurality of stacked dielectric films, two storages comprised of regions of the charge storage films CSF overlapping the two ends of the channel formation region CH, a single-layer dielectric film DF2 contacting the channel formation region CH between the storages, auxiliary layers (for example, bit lines BL1 and BL2) formed on two impurity regions S/D, two first control electrodes CG1 and CG2 formed on the auxiliary layers with dielectric film interposed and positioned on the storages, and a second control electrode WL buried in a state insulated from the first control electrodes CG1 and CG2 in a space between them and contacting the single-layer dielectric film DF2. Since the main regions on facing surfaces of the first control electrodes CG1 and CG2 become forward tapered, conductive residue is not left at the time of processing the second control electrode WL.

14 Claims, 13 Drawing Sheets

NON-VOLATILE SEMICONDUCTOR MEMORY DEVICE AND A METHOD OF PRODUCING THE SAME

RELATED APPLICATION DATA

The present application claims priority to Japanese Application Nos. P2000-328127 filed on Oct. 27, 2000; P2001-106309 filed Apr. 4, 2001 and PCT/JP01/09390 filed Oct. 25, 2001 and is a divisional of U.S. application Ser. No. 10/168,921 filed Oct. 2, 2002, now U.S. Pat. No. 6,803,620, all of which are incorporated herein by reference to the extent permitted by law.

TECHNICAL FIELD

The present invention relates to a non-volatile semiconductor memory device having two storages, each comprised of a charge storage film comprised of a plurality of stacked dielectric films, at the two ends of a channel formation region and capable of independently storing two bits of information in the storages and a method of producing the same.

BACKGROUND OF THE INVENTION

Known in the art are so-called "MONOS" (metal oxide nitride oxide semiconductor) type and other non-volatile semiconductor memory devices having charge storage films comprised of a stacked plurality of dielectric films and storing information by controlling amounts of charges stored in charge traps in the charge storage films.

Recently, technology taking note of the fact that it is possible to inject a charge into part of a region of distribution of dispersed charge traps by the conventional CHE (channel hot electron) injection method and independently write binary information at a source side and a drain side of a charge storage film so as to enable independent storage of two bits of information in one memory cell has been reported.

For example, in "2000 Symposium on VLSI Technology, pp. 122–123", charge storage films are separately provided on the source side and the drain side, control electrodes are provided on the charge storage films, and word gate electrodes are provided at a center portion of a channel between the control electrodes in a state with a single-layer dielectric film not having a charge holding ability interposed. The word gate electrodes are connected to a word line, while the control electrodes are laid in a direction orthogonal to the word line and are controlled separately from the word gate electrodes. Therefore, the controllability of a position of charge injection and the charge injection efficiency can be improved and, as a result, a high speed write operation is attained.

The memory cells, which are called "twin MONOS cells", have word gate electrodes repeated at a certain interval in the row direction, and have sidewall type conductive layers on wall surfaces on the two sides of the same in the row direction. ONO (oxide-nitride-oxide) films, namely, charge storage films having a charge holding ability, are provided directly under the sidewall type conductive layers. As opposed to this, single layers of dielectric films are formed directly under the word gate electrodes, thus these parts do not have any charge holding ability.

The sidewall type conductive layers and the word gate electrodes are used as masks for introducing N-type impurities to substrate locations exposed between adjacent sidewall type conductive layers to form N+-type impurity regions serving as sources or drains.

The above paper did not disclose a specific production method, but a twin MONOS cell has the following problems in production and structure.

In twin MONOS cells, the word gate electrodes are formed, then sidewall type conductive layers are formed at their sides. Thus, a step of connecting the word gate electrodes to the word line is necessary.

Further, the word gate electrodes in twin MONOS cells first need to be patterned to parallel line shapes long in the column direction. At this time, normally, the word gate electrode material is deposited, then patterns of a resist are formed on it and the word gate electrode material is processed by an etching method having strong anisotropy, for example, by RIE (reactive ion etching), using the resist as a mask. The resist patterns normally are tapered forward in sectional shapes at their side surfaces, and the resist recesses somewhat at the time of etching, so the sides of the word gate electrodes after the processing also are tapered forward. Further, even when a resist is not used and a material which does not recess at the time of etching is used, forward tapering is liable to arise to a certain extent at the side surfaces of the word gate electrodes after the processing due to the effect of sidewall deposits at the time of etching.

The word gate electrodes for example need to be simultaneously processed when patterning the word lines to isolate them for cells. However, at this time, since the control gates are already formed at the sidewalls of the word gate electrodes in a state having insulation films interposed, the word gate electrodes have to be selectively etched and removed while digging holes having trapezoidal sectional shapes. Accordingly, at the time of this etching, the bottom sides of the side surfaces of the reverse tapered control electrodes are difficult to etch and conductive residue easily is produced in these portions along the control electrodes. If conductive residue is produced, short-circuit occur between the word lines.

Further, the sidewall type conductive layers are formed in ring shapes circling the periphery of the line shaped conductive layers for forming the word gate electrodes. If the sidewall type conductive layers are used for the control electrodes as they are, a control electrode on the source side and a control electrode on the drain side would become electrically short-circuited. Therefore, to supply different voltages to the control electrode on the source side and the control electrode on the drain side, the two control electrodes have to be isolated. This isolation cannot be performed all together in another step, for example, at the time of processing the word lines, so for example a step of forming an etching mask opened only at the two end portions of the line shaped conductive layers for forming the word gate electrodes, removing an insulation film covering the sidewall type conductive layers through the openings, and cutting the conductive layers by etching becomes necessary.

Furthermore, in a twin MONOS cell, since ONO films are formed directly under the sidewall type conductive layers, the ONO films contacting the channel formation region extend long in the column direction along the sidewall type conductive layers. During operation, data is written by injecting charges to a region of an ONO film crossing with a channel (hereinafter referred to as a storage), while data is erased by draining the stored charge to the substrate side or by injecting a reverse conductivity type charge. When repeating this rewrite operation, a charge is liable to accumulate continuously in an adjacent region of the storage. Further, a leak path to the outside of the channel is liable to be formed by the charge. When erasing data by draining the stored charges, which are electrons, from the entire surface of the channel, since the adjacent region is also under control of a control electrode in the same way as the storage and electrons accumulated at the adjacent region are also drained at the same time, this does not become much of a problem. However, particularly when injecting a charge having a reverse polarity to a storage for erasing stored charge, if a charge having a polarity of a direction turning on the channel, for example, an electron hole in the case of an N-type channel, is accumulated in an adjacent region of the storage, a leak path will be easily formed. The resultant decline of the leak characteristic therefore becomes a problem.

SUMMARY OF THE INVENTION

A first object of the present invention is to eliminate the need for a step of connecting word gate electrodes and a word line by structurally enabling formation of the word gate electrodes and word line (second control electrode) as an integral member.

A second object of the present invention is to prevent production of conductive residue which would cause short-circuit between word lines and to structurally eliminate the need for a step of cutting apart two control electrodes in a single cell.

A third object of the present invention is to prevent an unnecessary charge from accumulating in an adjacent region of a storage in a direction along a control electrode or between storages and to achieve a structure where no leakage current occurs.

To attain the above first and second objects, a non-volatile semiconductor memory device according to a first aspect of the present invention comprises a memory cell, the memory cell comprising a channel formation region comprised of a semiconductor, charge storage films each comprised of a stacked plurality of dielectric films and having a charge holding ability, two storages comprised of regions of the charge storage films overlapping two ends of the channel formation region, a single-layer dielectric film contacting the channel formation region between the storages, two first control electrodes formed one each of the storages so that main regions on mutually facing surfaces become forward tapered, and a second control electrode buried in a space between the two first control electrodes in a state insulated from the first control electrodes and contacting the single-layer dielectric film.

The memory cell further comprises two impurity regions comprised of a semiconductor of a reverse conductivity type from the above channel formation region and mutually separated across the channel formation region and two auxiliary layers formed on the two impurity regions close to each surface of the first control electrodes facing the outside of the memory cell.

The auxiliary layers are comprised of conductive layers close to outside surfaces of the first control electrodes in a state with dielectric films interposed or layers of polycrystalline silicon or amorphous silicon doped with an impurity of the same conductivity type as the impurity regions. Alternatively, the auxiliary layers are comprised of dielectric layers close to the outside surfaces of the first control electrodes.

In a configuration arranging a plurality of memory cells in a matrix, two first control electrodes straddling from the two sides in the width direction an auxiliary layer shared by two memory cells adjacent in the row direction may be made sidewall shapes or may be made shapes connected above the auxiliary layer. First control electrodes of the latter shape are comprised of conductive layers covering the two sides and upper surface of the auxiliary layer and have a lower interconnection resistance comparing with that in the sidewall shapes.

To achieve the third object, a non-volatile semiconductor memory device according to a second aspect of the present invention comprises a plurality of memory cells, each of the memory cells comprising a channel formation region comprised of a first conductivity type semiconductor, first and second impurity regions comprised of a second conductivity type semiconductor and separated from each other straddling the channel formation region, control electrodes arranged long in a direction orthogonal to a direction of separation of the first and second impurity regions and shared by a plurality of memory cells, and charge storage films each comprised of a plurality of dielectric films formed at layers directly below the control electrodes and storing information in portions overlapping the channel formation region. The memory device wherein memory cells adjacent in the direction orthogonal to the direction of separation of the first and second impurity regions being electrically isolated by dielectric isolation layers; and pairs of the first impurity regions and pairs of second impurity regions of the adjacent memory cells isolated by the dielectric isolation layer being connected respectively by conductive layers.

To achieve the first and second objects, a method of producing a non-volatile semiconductor memory device according to a third aspect of the present invention comprises a method of producing a non-volatile semiconductor memory device comprising a channel formation region comprised of a first conductivity type semiconductor, two impurity regions separated from each other straddling the channel formation region and comprised of a second conductivity type semiconductor, two first control electrodes formed on two ends of the channel formation region close to the two impurity regions in a state with charge storage films, each comprised of a plurality of dielectric films, interposed, and a second control electrode facing the channel formation region between the first control electrodes in a state with a single-layer dielectric film interposed and arranged long in the direction of separation of the impurity regions, including the steps of forming auxiliary layers in line shapes long in a direction orthogonal to a direction of separation of the impurity regions on the impurity regions or semiconductor regions where the impurity regions are to be formed; forming the charge storage film on surfaces of the auxiliary layers and a surface of the channel formation region; forming the first control electrodes along the auxiliary layers in a state with the charge storage film interposed; removing part of the charge storage film by etching using the first control electrodes as a mask; forming a single-layer dielectric film on a surface of the channel formation region exposed by the removal of the charge storage film and surfaces of the first control electrodes; and forming the second control electrodes on the single-layer dielectric film and the auxiliary layers.

To achieve the third object, the method of producing a non-volatile semiconductor memory device according to the third aspect of the present invention further includes the steps of forming dielectric isolation layers in parallel line shapes long in one direction in a conductor of a first conductivity type and forming auxiliary layers comprised of polycrystalline silicon or amorphous silicon doped with a second conductivity type impurity in parallel line shapes long in a direction orthogonal to the dielectric isolation layers and forming the impurity regions of the second conductivity type at semiconductor locations overlapping regions of arrangement of the auxiliary layers between the dielectric isolation layers.

According to the non-volatile semiconductor memory device according to the first aspect and the method of producing a non-volatile semiconductor memory device according to the third aspect of the present invention, since the main regions on facing surfaces of two first control electrodes comprising one memory cell become forward tapered, residue of a conductive substance which induces short-circuit between second control electrodes when processing the second control electrodes is not generated. Further, formation of word lines is completed just by processing the second control electrodes.

According to the non-volatile semiconductor memory device according to the second aspect of the present invention, the regions of the charge storage films adjacent to the portions of the charge storage films forming storages at the two sides in the longitudinal direction of the first control electrodes ride up over the dielectric isolation layers between the channel formation regions. By just making the thickness of the dielectric isolation layers for example about several tens of nm, even when charges are stored in the adjacent regions, the effect of the charges to the semiconductor directly under the dielectric isolation layers becomes extremely weak comparing with that in conventional cases.

DETAILED DESCRIPTION OF THE PRESENTLY PREFERRED EMBODIMENTS

Embodiments of the present invention will be explained next with reference to the attached drawings.

First Embodiment

Below, an embodiment of the present invention will be explained with reference to the drawings by taking as an example a non-volatile memory using N-type channel memory cells and having a memory cell array of a VG (virtual ground) type.

Figure 1A:
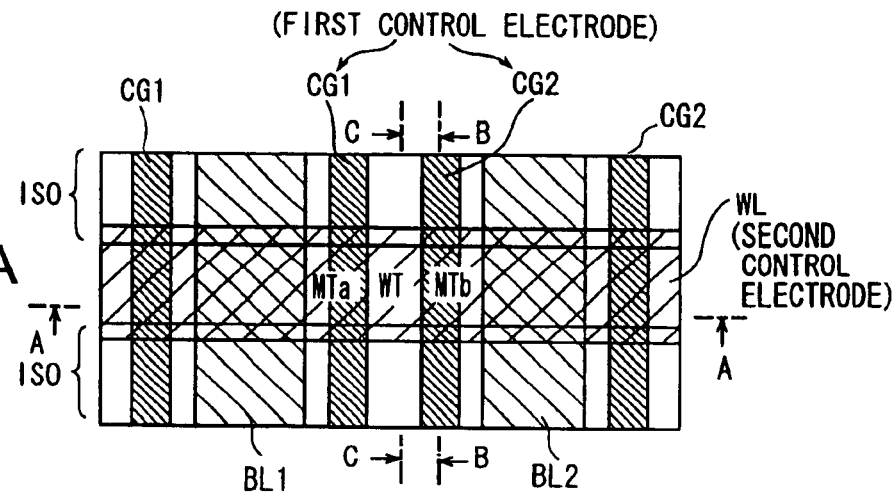
FIG. 1A is a plan view of a memory cell according to an embodiment.
Figure 1B:
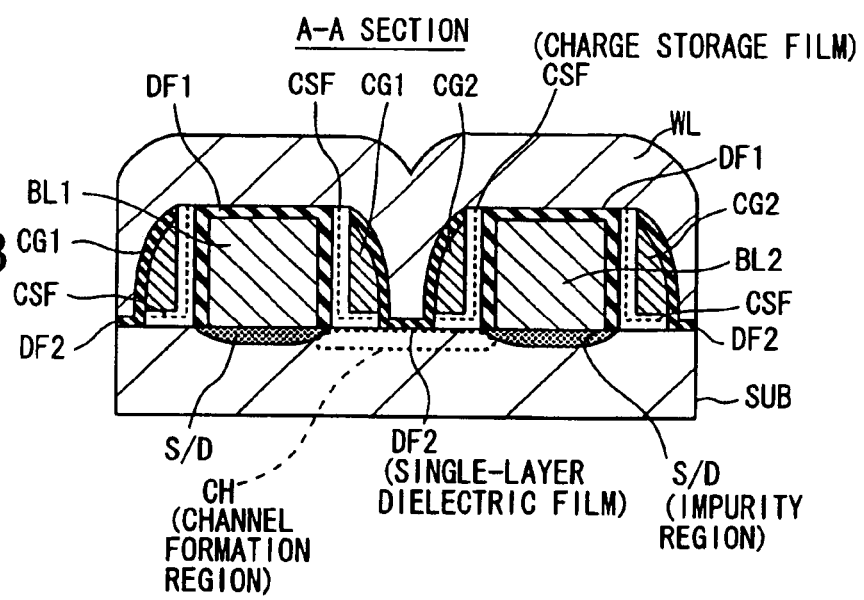
FIG. 1B is a sectional view along a line A—A in FIG. 1A.
Figure 2A:
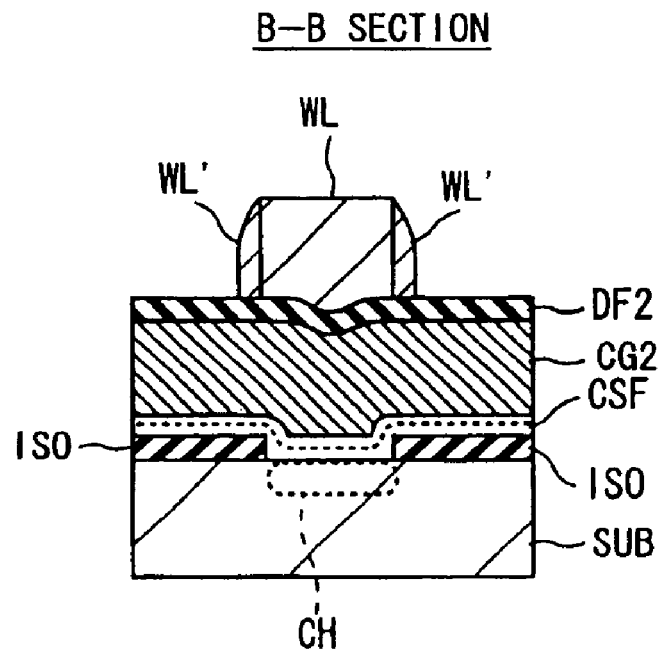
FIG. 2A is a sectional view along a line B—B in FIG. 1A in the memory cell according to the embodiment.
Figure 2B:
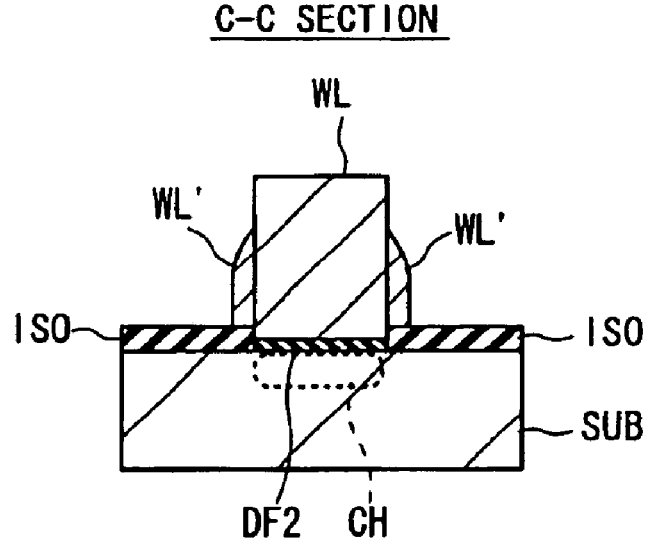
FIG. 2B is a sectional view along a line C—C in FIG. 1A.

FIG. 1A is a plan view of a memory cell, while FIG. 1B is a sectional view along the line A—A in FIG. 1A. FIG. 2A is a sectional view along the line B—B in FIG. 1A, while FIG. 2B is a sectional view along the line C—C in FIG. 1A.

In these figures, SUB indicates a P-type semiconductor substrate or P-type well or SOI (silicon on insulator) layer and other various types of P-type semiconductor layers. For convenience, they are hereinafter referred to as the "substrate SUB".

The substrate SUB has formed on it dielectric isolation layers ISO of parallel stripe shapes long in the horizontal direction (row direction) in the figures. The dielectric layer isolation layers ISO are formed by any one of a LOCOS (local oxidation of silicon) method, an STI (shallow trench isolation) method, or a field isolation method. Here, the field isolation method is adopted and a dielectric film (dielectric isolation layer ISO) having a thickness of tens of nm is formed on the substrate SUB. The line-shaped region long in the row direction between the dielectric isolation layers ISO is a semiconductor active region of the memory cell.

In the semiconductor active region, source/drain regions S/D doped with an N-type impurity are formed at a predetermined interval. The part of the semiconductor active region between the source/drain regions S/D is a channel formation region CH of a transistor.

Bit lines BL1 and BL2 comprised of polycrystalline silicon doped with an N-type impurity at a high concentration are formed in a parallel line shape in the vertical direction (column direction) of the figure orthogonal with respect to the row direction. The bit lines BL1 and BL2 contact the source/drain regions S/D of the memory cell in the column direction while cutting across the dielectric isolation layers ISO and supply a common source voltage or a drain voltage to the memory cell. The thickness of the polycrystalline silicon comprising the bit lines BL1 and BL2 is for example about 100 nm to 500 nm. The surfaces of the polycrystalline silicon are covered with dielectric films DF1.

Charge storage films CSF each comprised of a plurality of dielectric films are formed in a state contacting the dielectric films DF1 at the sides of the bit lines BL1 and BL2 and the end portions of the channel formation region. The charge storage films CSF have L-section shapes and are formed on their bottom portions with first control electrodes (hereinafter, referred to as control gates) CG1 and CG2 of sidewall shapes. The control gates CG1 and CG2 are arranged together with the charge storage films CSF long in the column direction along the bit lines BL1 and BL2. The control gates CG1 and CG2, explained in detail later, are formed, for example, by depositing a film of polycrystalline silicon in a state with the surfaces of the bit lines BL1 and BL2 covered by the dielectric films DF1 and charge storage films CSF and etching back the same. The control gates CG1 and CG2 are supported in a state with dielectric films interposed at the side surfaces of the bit lines BL1 and BL2. Accordingly, the bit lines BL1 and BL2 function as "auxiliary layers" for the control gates CG1 and CG2. Further, the charge storage film portions sandwiched between the control electrodes CG1 and CG2 and the channel formation region CH, namely, the bottom portions of the charge storage films CSF, become "storages" to which charges are injected for storing information.

The main regions of facing surfaces of the control gates CG1 and CG2 are forward tapered. The advantages of the facing surfaces being forward tapered will be explained later. A single-layer dielectric film DF2 is formed on the facing surfaces of the control gates CG1 and CG2 and on the channel formation region CH.

A word line WL is formed by a conductive substance burying the space between the control gates. The word line WL is formed in substantially the same pattern as the semiconductor active region while cutting across the dielectric films DF1 on the bit lines BL1 and BL2. Further, sidewalls WL' comprised of a conductive substance are formed at the side surfaces of the two sides of the word line WL in the width direction.

The reason for providing the sidewalls WL' is as follows:

To minimize the cell size in the column direction, it is desirable that the lines and spaces of the dielectric isolation layers ISO and the line and space of the word line WL both be formed by a minimum line width F determined by a resolution limit of photolithography etc. In this case, the width of the space between the dielectric isolation layers ISO, that is, the width of the semiconductor active region, inevitably becomes almost identical with the width of the word line WL, so there is no longer an extra margin for positioning the two. Accordingly, in the space between the facing control gates CG1 and CG2 shown in FIG. 2B, when the word line WL deviates in the width direction with respect to the semiconductor active region (channel formation region CH), a region which is not superimposed on the word line WL ends up being formed at part of the channel formation region CH. Since the region is not subject to the electric field of the word line WL, it becomes a leak path between the source and drain. As a result, the channel can no longer be turned off. Particularly, due to deviation of the word line in the width direction, a region where hot electrons are not injected is formed at an end of the storage. However, when erasing information using injection of hot holes, since the end of the storage is subject to the electric field of the control gate, the hot holes are injected to the end of the storage, only the threshold voltage of the portion of the semiconductor immediately under the end declines, and a leakage current ends up increasing through that portion.

Further, there is the problem of a reduction of the channel width due to deviation of the word line WL. A reduction of the word line width leads to a decline of the read current. Together with the increase of the leakage current, this is accompanied with the disadvantage that the decline of the S/N ratio of a read signal is accelerated.

In the present embodiment, by providing the sidewalls WL' substantially enlarging the width of the word line WL on the side surfaces of the word line WL, it becomes possible to prevent above explained formation of a leak path and reduction of the channel width while forming the word line WL to a minimum line width F. Note that the widths of the sidewalls WL' need to be the same as or more than the adjustment margin of photolithography to attain the object. Further, to attain the object, it is important at the time of processing the word line WL not to continue and etch the underlying dielectric film DF2. The reason is because if the dielectric film DF2 does not completely cover the surface of the channel formation region CH, the sidewalls WL' will directly contact the surface of the channel formation region CH when the word line WL deviates in the width direction in FIG. 2B. Therefore, this situation has to be prevented.

A memory cell having the above configuration is formed by connecting in series a center word transistor WT having a word line WL as a gate and two memory transistors MTa and MTb positioned at the two sides of the word transistor WT and having the control gates CG1 and CG2. Namely, during operation, the word transistor WT functions by using channels of the two memory transistors MTa and MTh as a source and a drain, while the memory transistors MTa and MTb function by using any one of the source/drain region S/D and the channel of the word transistor WT as a source and a drain.

Figure 3:
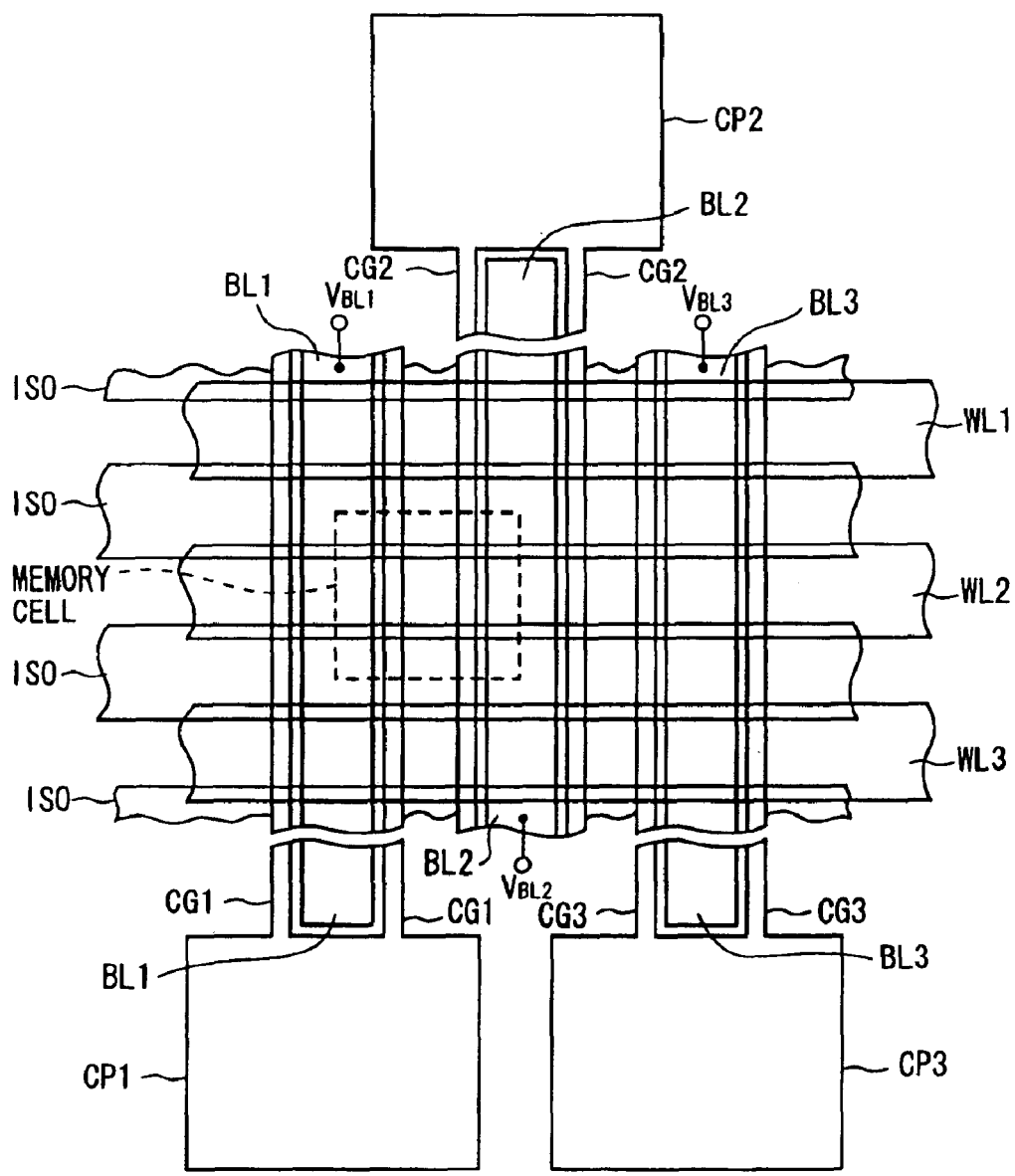
FIG. 3 is a plan view of a memory cell array also showing pads for leading out electrodes of control gates in a non-volatile memory cell according to the embodiment.

FIG. 3 is a plan view of a memory cell array showing also pads for leading out the electrodes of the control gates.

The illustrated example corresponds to a control method which controls the pair of control gates CG1, the pair of control gates CG2, and the pair of control gates CG3 at the two sides of a bit line by the same potential. In the present embodiment, since the control gates are comprised of sidewall type conductive layers formed around the bit lines, the two control gates in one memory cell, that is, the control gates CG1 and CG2 or control gates CG2 and CG3, are already isolated at the time of forming the control gates. Accordingly, it is not necessary to cut the two control gates in the one memory cell apart.

For forming control pads CP1, CP2, and CP3, when forming the control gates, a conductive film for forming the control gates is deposited, then etching protective layers of large areas and rectangular patterns are formed on the regions for forming the control pads CP1, CP2, and CP3 and then are etched back. After etch-back, the etching protective layer is removed, whereupon control pads CP1, CP2, and CP3 are left at those portions. FIG. 3 is an example of forming control pads so as to connect to short sides of ring-shaped control gates.

Note that when it is desired to improve the degree of freedom of serial access between memory cells in the row direction by separately supplying different voltages to the control gates between adjacent cells, a step of cutting apart the control gates at the two sides of a bit line becomes necessary and control pads need to be separately formed for the cut control gates.

Figure 4:
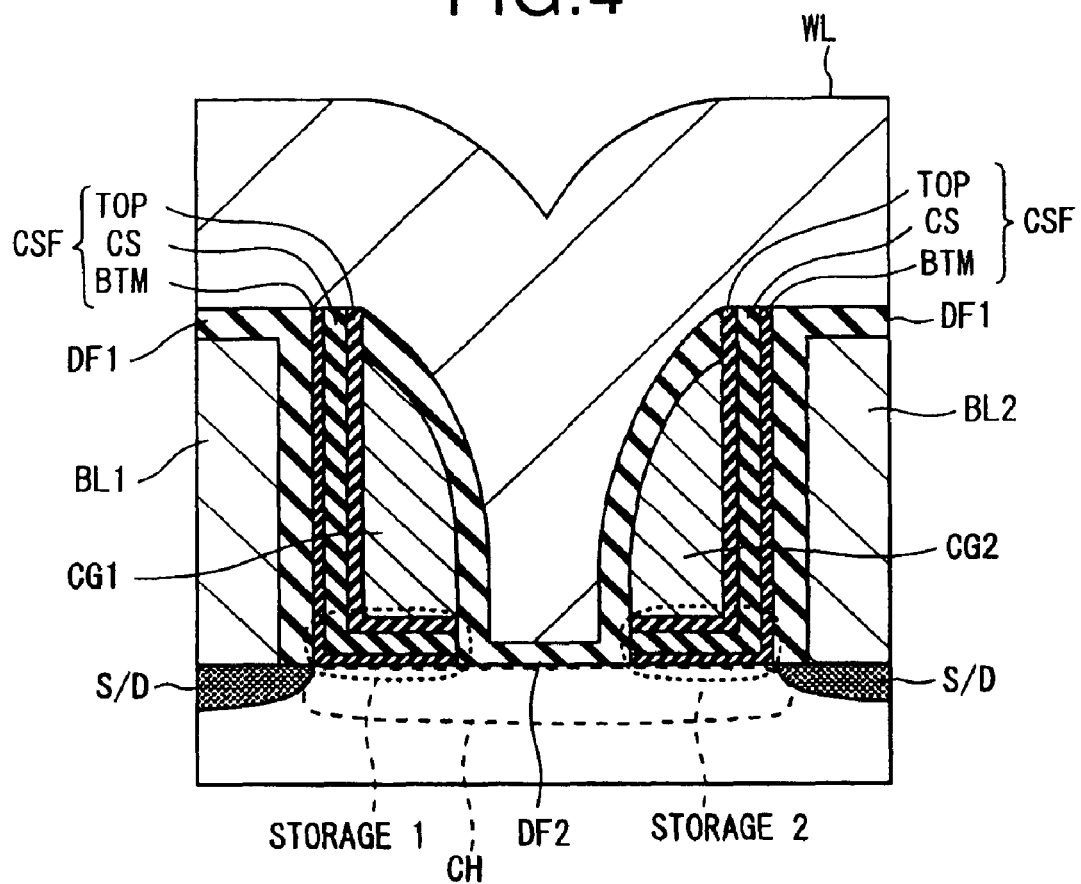
FIG. 4 is a sectional view showing enlarged a key portion of the memory cell in FIG. 1A according to the embodiment.

FIG. 4 is a sectional view showing enlarged a key portion of a memory cell.

As shown in FIG. 4, charge storage films CSF are for example comprised of three layers of dielectric film. A bottommost bottom film BTM and a topmost top film TOP are for example comprised of silicon dioxide, silicon oxynitride, or silicon nitride having less charge traps. The bottom film BTM functions as a potential barrier with the substrate, while the top film TOP functions as a film for preventing a stored charge from escaping to the gate side or an unnecessary charge from entering from the gate side. A center film CS contains a large number of charge traps and functions as a film for mainly storing a charge. The center film CS is comprised of silicon nitride or silicon oxynitride containing a large number of traps or an insulating substance (dielectric) comprised of a metal oxide etc.

When injecting a charge at a storage 1 at the time of a write operation, a positive drain voltage is supplied to the bit line BL1, a reference voltage is supplied to the bit line BL2, individually optimized positive voltages are supplied to the control gates CG1 and CG2, and a positive voltage of a degree forming a channel is supplied to the word line WL. At this time, electrons supplied from the source/drain region S/D connected to the bit line BL2 to the channel are accelerated in the channel, obtain a high energy at the source/drain region S/D side connected to the bit line BL1, pass over the potential barrier of the bottom film BTM, and are injected to the storage 1 and stored.

When injecting charges to the storage 2, voltages are switched between the control gates CG1 and CG2, and voltages are switched between the bit lines BL1 and BL2. As a result, the electron supply side and the side where electrons become hot energy wise become reverse from the above case, and electrons are injected to the storage 2.

At the time of a read operation, a predetermined read drain voltage is supplied between the bit lines BL1 and BL2 so that the storage side at which a bit to be read is written becomes the source. Further, optimized positive voltages low to an extent capable of turning on the channel but not changing the threshold voltages of the memory transistors MTa and MTb are supplied to the control gates CG1 and CG2 and the word line WL. At this time, the channel conductivity effectively changes due to the difference in the amount of the stored charge of the storage to be read or the presence of charges. As a result, stored information is converted to a current amount or a potential difference on the drain side and read.

When reading the other bit, the bit line voltages are switched or the control gate voltages are switched so that the storage side in which the bit is written becomes the source and thereby a read operation conducted in the same way as above.

At the time of an erase operation, an erase voltage of a reverse direction from that at the above write operation is supplied so that the channel formation region CH and source/drain region S/D side becomes high and the control gate electrode CG1 and/or CG2 side becomes low. As a result, the stored charge is drained from one or both of the storages to the substrate SUB side and the memory transistor returns to the erased state. Note that as another erasing method, a method of pulling in a high energy charge having an inverse polarity to the stored charge generated near a not shown PN junction at the source/drain region S/D side or inside the substrate by an electric field of the control gates for injection into the storage can be also adopted.

Next, a method of producing a memory cell will be explained with reference to the sectional views shown in FIG. 5 to FIG. 11.

Figure 5:
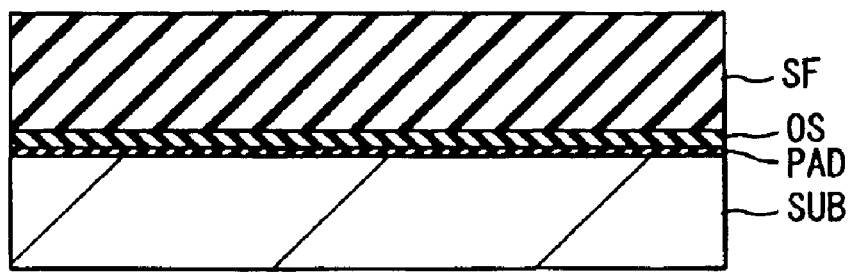
FIG. 5 is a sectional view after formation of a sacrificial layer in production of a memory cell according to the embodiment.
Figure 6:
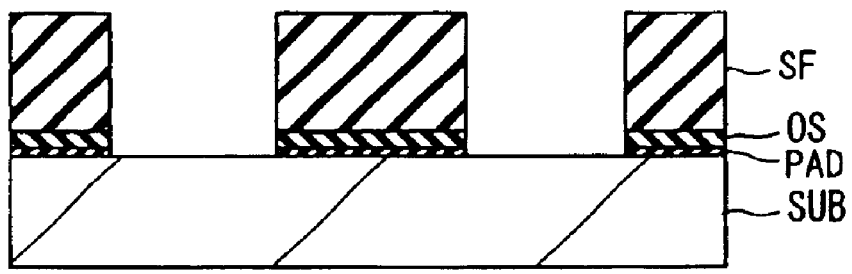
FIG. 6 is a sectional view after forming openings for patterns of bit lines in the sacrificial layer etc. in production of a memory cell according to the embodiment.

First, the substrate SUB, as shown in FIG. 1A and FIG. 3, is formed on it with parallel stripe shaped dielectric isolation layers ISO long in the column direction. On the entire surface of the dielectric isolation layers ISO and of the semiconductor active region between the dielectric isolation layers ISO, as shown in FIG. 5, are successively formed a pad layer PAD, an oxidation stop OS, and a sacrificial layer SF. The oxidation stop OS is a hard to oxidize dense film and for example is comprised of silicon nitride of about 50 nm. The pad layer PAD thereunder is a thin film formed in accordance with need for the purpose of improving adhesion of the oxidation stop OS to the substrate SUB and releasing stress and for example is comprised of silicon dioxide film of about 5 nm to 8 nm. The sacrificial layer SF is a film of a material having a higher selectivity at the time of etching than the oxidation stop OS and, for example, is comprised of a silicon dioxide film. The film thickness is determined in accordance with the height of the bit lines.

The stacked films PAD, OS, and SF are patterned using a resist etc. as a mask to form parallel stripe shaped openings long in the column direction. The dielectric isolation layers ISO and the semiconductor active regions are alternately arranged and exposed in the openings along the longitudinal direction.

Figure 7:
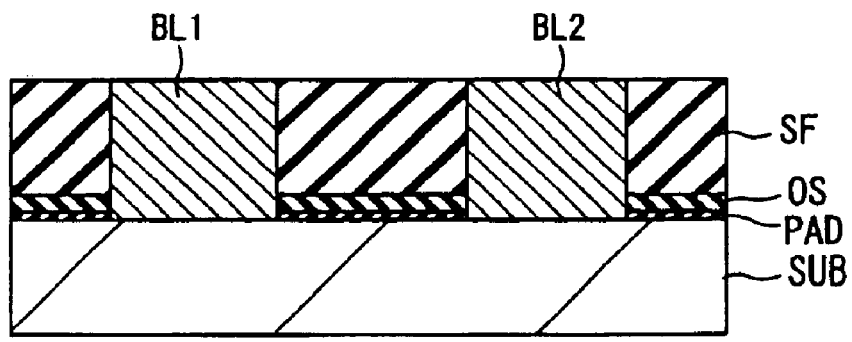
FIG. 7 is a sectional view after forming bit lines in production of a memory cell to the embodiment.

By thickly depositing polycrystalline silicon doped with an N-type impurity to a high concentration and polishing or etching back its surface, isolation occurs at the surface of the sacrificial layer SF. As a result, as shown in FIG. 7, bit lines BL1 and BL2 buried in the openings of the stacked films PAD, OS, and SF are formed. The bit lines BL1 and BL2 electrically connect the semiconductor active regions exposed at the bottom surfaces of the openings.

The sacrificial layer SF is selectively removed, then the exposed surfaces of the bit lines BL1 and BL2 are thermally oxidized to form a dielectric film DF1 of, for example, about 10 nm. By optimizing the thicknesses of the dielectric film DF1 and the oxidation stop OS, oxidation sufficiently proceeds even at the end surface sides of the oxidation stop OS, so the dielectric film DF1 having a sufficient thickness can completely cover the surfaces of the bit lines BL1 and BL2. Further, in the heating step, N-type impurities diffuse into the semiconductor active region by using the polycrystalline silicon comprising the bit lines BL1 and BL2 as a solid-state diffusion source. As a result, source/drain regions S/D are formed. Note that when a depth of the source/drain regions S/D and a concentration of impurities are insufficient by the diffusion alone, it is sufficient to introduce impurities of a necessary concentration in advance to the semiconductor active regions by additional heating or by ion implantation through the openings in the previous step in FIG. 6.

The oxidation stop OS and the pad layer PAD are successively removed and a charge storage film CSF formed on the entire surface including the exposed channel formation region CH and surfaces of the dielectric film DF1. Note that when the charge storage film CSF has a three-layer structure shown in FIG. 4 and the bottom film BTM is formed by thermal oxidation, the bottom film BTM is formed only on surface of the channel formation region CH.

Polycrystalline silicon sufficiently doped with impurities is thickly deposited and etching protective layers for forming the above explained control pads CP1, CP2, CP3 . . . shown in FIG. 3 are formed at necessary locations on the polycrystalline silicon, then the polycrystalline silicon is etched back. Due to this, control gates CG1 and CG2 of sidewall shapes are formed at the two side surfaces of the bit lines BL1 and BL2 in a state with dielectric films DF1 and the CSF interposed. Further, at the same time, control pads CP1, CP2, CP3 . . . suitably connected to the control gates CG1, CG2, CG3 . . . are formed. At this time, the thickness of the polycrystalline silicon sufficiently doped with impurities is strictly controlled by determining the control gate width.

Next, the etching protective layer is removed.

To obtain the structure in FIG. 1B, first the charge storage film CSF is etched using the control gates CG1 and CG2 as masks. Due to this, the portion of the charge storage film on the channel formation region CH between the control electrodes CG1 and CG2 and the portions of the charge storage film above the bit lines BL1 and BL2 are removed. Next, the surface is thermally oxidized to form a silicon dioxide film on the surfaces of the control electrodes CG1 and CG2 and the surface of the channel formation region CH exposed between the control gates CG1 and CG2. Due to this, a single-layer dielectric film DF2 is formed on the surfaces of the polycrystalline silicon or monocrystalline silicon, but the other portions not thermally oxidized much at all since they are comprised of dielectric film. Note that since the thickness of the thermal oxidation of the doped polycrystalline silicon becomes twice the thickness of the monocrystalline silicon, even when the thickness of the gate oxide film of a MOS transistor at the center is thin, insulation between interconnections is sufficiently secured.

Next, a conductive material for forming the word line is thickly deposited on the entire surface and parallel stripe shaped patterns of a resist etc. long in the row direction are formed on it. The conductive material is processed by RIE or other etching having a strong anisotropy using the patterns as a mask to form a word line WL. Further, sidewalls WL1 of the word line WL shown in FIG. 2B are formed. Due to the above, the basic structure of a memory cell is completed.

Next, advantages of the memory cell structure according to the present embodiment over the memory cell structure described in the above paper showing the prior art will be explained. Note that in the following explanation, a case where a control gate is divided into two sidewalls in the sectional structure described in the above paper will be used as a comparative example, but the advantages of the present invention remain same even if not dividing the control gate.

Figure 12A:
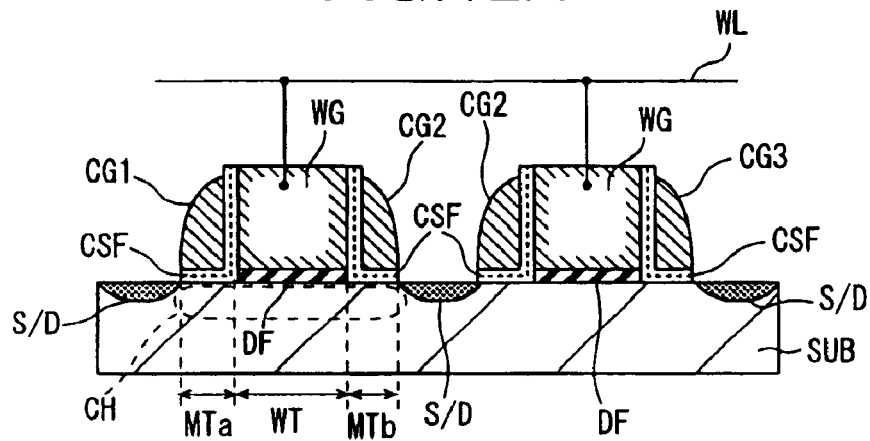
FIG. 12A is a schematic sectional view of the structure of a memory cell according to a comparative example of the embodiment.
Figure 12B:
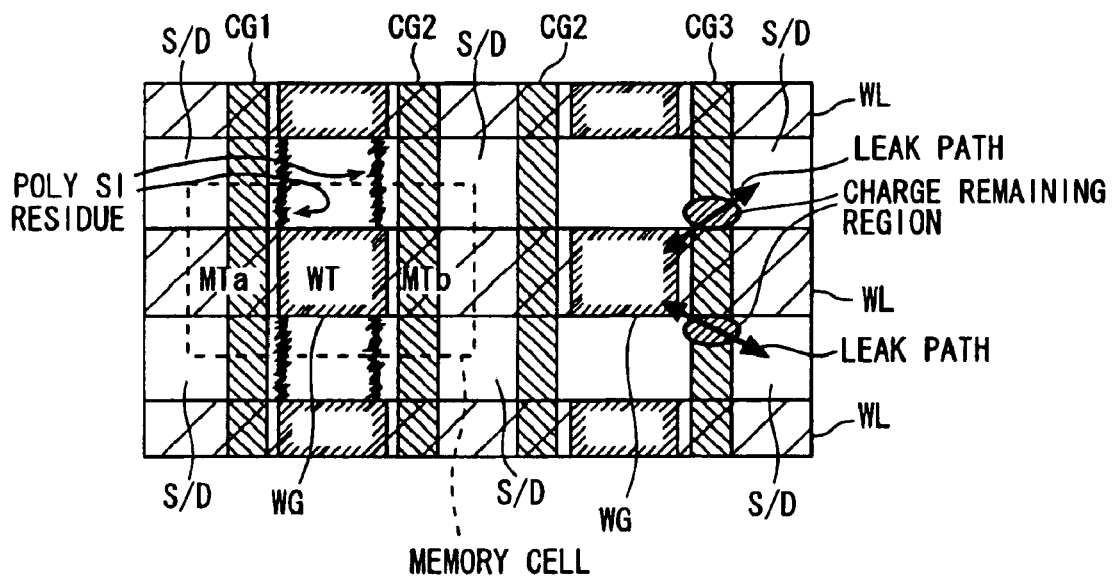
FIG. 12B is a plan view of a memory cell array centered on two memory cells according to the comparative example of the embodiment.
Figure 13:
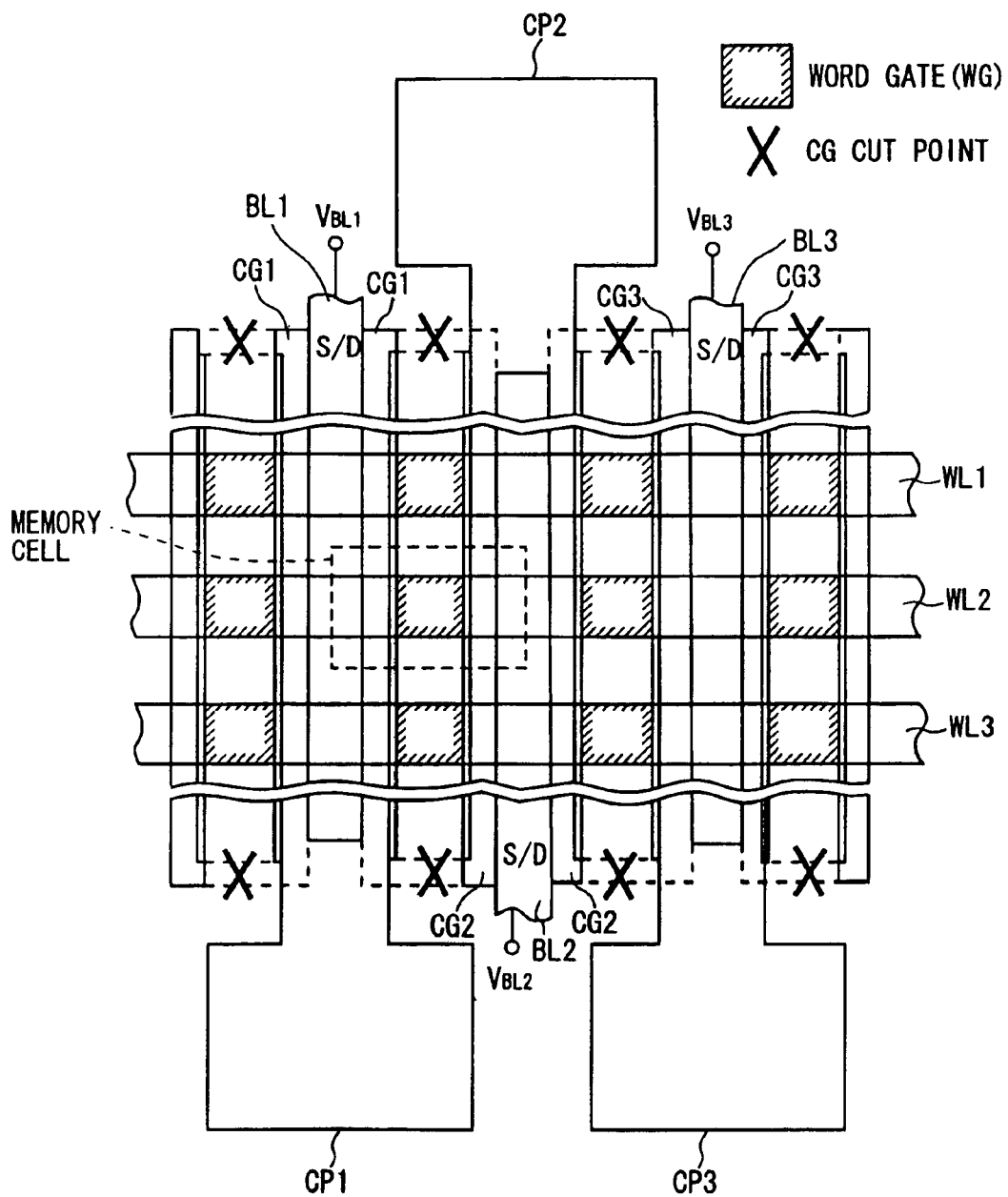
FIG. 13 is a plan view of a memory cell array and control pads according to the comparative example of the embodiment.

FIG. 12A is a view showing the sectional structure of the cell described in the above paper in the row direction when dividing a control gate into two. FIG. 12B is a plan view drawn centered about two memory cells. FIG. 13 is a plan view of a memory cell array including control pads. Note that in these figures, reference numbers indicating common configurations as those in the present embodiment are standardized with those used in the present embodiment.

The memory cell of the comparative example is common with the memory cell of the present embodiment in the basic cell configuration including the point of a word transistor WT and two memory transistors MTa and MTb sandwiching it being serially connected.

However, the memory cell of the comparative example differs greatly in structure from the memory cell of the present embodiment in the point it has word gates WG connected to a word line WL and is formed with control gates CG1, CG2, and CG3 of sidewall shapes at the side surfaces in a state with charge storage films CSF interposed an the point that it does not have dielectric isolation layers ISO for isolating cells in the column direction. The control gates CG1, CG2, and CG3 have to be formed long in the column direction, so the word gates WG forming auxiliary layers at the time of formation also have to be formed in parallel stripe shapes long in the column direction. On the other hand, however, to electrically isolate word lines WL, it is necessary to cut the stripe shaped word gates WG into isolated patterns for each cell. These points are clear from the cell structure.

Below, a production method expected from the cell structure of the comparative example will be simply explained in order.

First, a single-layer dielectric film DF and a conductive film for forming word gates WG are deposited on a substrate SUB and patterned to form parallel stripe patterns long in the column direction. A charge storage film CSF comprised of an ONO film is formed on the entire surface including the pattern surfaces and the substrate SUB surface. In this state, polycrystalline silicon doped with impurities is thickly deposited so as to bury the spaces between conductive layers for forming the word gates WG. Etching protective layers are formed at necessary locations, for example, positions of the control pads CP1, CP2, CP3, . . . shown in FIG. 13. In that state, the polycrystalline silicon is etched back under conditions of strong anisotropy. As a result, sidewalls comprised of polycrystalline silicon are formed as control gates CG1, CG1, CG2, CG2, CG3, CG3, . . . at the two sides of the conductive layers for forming the word gates WG in a state with the charge storage film CSF interposed. Further, at the same time, the control pads CP1, CP2, CP3, . . . are formed. The surfaces of the sidewalls comprised of the polycrystalline silicon (polycrystalline silicon sidewalls) are oxidized by thermal oxidation, then N-type impurities are injected to the regions of the substrate surface between the polycrystalline silicon sidewalls by ion implantation using the polycrystalline silicon sidewalls and conductive layers for forming word gates WG as masks and using the charge storage film CSF between the polycrystalline silicon sidewalls as a through film so as to form source/drain regions S/D. Then, the spaces between the polycrystalline silicon sidewalls are buried with silicon dioxide or another dielectric, then polished or etched back to flatten the surface of the dielectric so that the surface heights become substantially equal to those of the conductive layers for forming the word gates WG. The flattening exposes the surfaces of the conductive layers for forming the word gates WG, but stops at an extent not exposing the surfaces of the polycrystalline silicon sidewalls due to the presence of the thermal oxide film. Next, a conductive material for forming the word lines WL is deposited on the flattened surface, and parallel stripe shaped resists long in the row direction are formed thereon. The conductor is etched by using the resist as a mask to isolate the word lines WL. Also, next, the conductive layer exposed at the bottom between the word lines WL is divided by etching. As a result, word gates WG are formed by patterns isolated for each cell.

A first problem of the comparative example is the fact that residue of polycrystalline silicon is liable to be produced at the time of dividing the conductive layers for forming the word gates WG into patterns for each cell in the final step. Namely, as explained above, because the cross-section of a conductive layer for forming a word gate WG is a trapezoid, when dividing it, it becomes necessary to dig a hole having a reverse tapered side surface. As a result, polycrystalline silicon is liable to be left in a strip at the deepest location of the shadowed part seen from the surface opening, that is, a portion along the bottom side of the side surface as shown in FIG. 12B. Since such residue of the polycrystalline silicon causes electrical short-circuit between word gates WG, the memory cell array suffers from short-circuits of the word lines.

In the cell structure according to the present embodiment, since there are no conductive layers for forming the word gates WG, division of the same is unnecessary. Further, at the time of isolating the word lines WL, the bases of the portions etched away have forward tapered side surfaces reflecting the shapes of the sidewall type control gates. Accordingly, there is an advantage that conductive material is not easily left at those portions.

A second problem of the comparative example is that there are no dielectric isolation layers ISO as in the present embodiment, so charges are liable to continuously accumulate in regions of the charge storage films CSF adjacent to storages when repeating rewrite operations many times. Particularly, charges only injected at rewrite operations, for example, reverse polarity charges (electron holes) injected for erasure, are only injected, not drained, so they easily gradually accumulate in these regions. As a result, leak paths are easily formed outside the channels. FIG. 12B shows charge accumulation regions and the directions of the leak paths.

In the present embodiment, the portion of the charge storage film CSF contacting the channel formation region CH in FIG. 2A corresponds to a storage. The adjacent regions of the storage ride up over the dielectric isolation layers ISO. Accordingly, there is an advantage that although charges continuously accumulate in the adjacent region, the charges do not affect the channel and no leak paths are produced. Note that when the dielectric isolation layers are formed by the LOCOS method or the STI method, a leakage current becomes further hard to form since the surface region of the substrate is insulated.

As a third problem of the comparative example, as shown in FIG. 13, since the control gates are formed in ring shapes circling the conductive layers for forming the word gates WG, the control gates have to be cut, for example, at two points at the short sides of the conductive layers. This is because unless the two control gates CG1 and CG2, CG2 and CG3, . . . in one memory cell can be independently supplied with different voltages, efficient two-bit storage operations become hard.

In the cell structure of the present embodiment, the two control gates CG1 and CG2, CG2 and CG3, . . . in each memory cell are already isolated at the time of formation as shown in FIG. 3. Accordingly, in the present embodiment, so far as adjacent control gates CG1 and CG1, CG2 and CG2, . . . are used at the same potentials, there is an advantage that the step of cutting the control gates is unnecessary. Note that when desiring to independently control all of the control gates to heighten the degree of freedom of a serial access operation of a VG cell array, the control gates CG1 and CG1, CG2 and CG2, . . . in FIG. 3 need to be cut. The cutting locations of the control gates just differ from the comparative example. The number of the locations to cut is the same.

Other than the above, in the present embodiment, an auxiliary layer is comprised of a conductive material (for example, polycrystalline silicon doped with impurities) and the resistances of the bit lines BL1, BL2, . . . are reduced compared with the comparative example forming the same only by impurity regions in which bit lines are buried in the semiconductor.

Further, in the present embodiment, it is possible to reduce the channel lengths of the word transistors WT from the minimum line width F. The sources and drains of the word transistors WT are the channels of the memory transistors MTa and MTb, so even if making the channel lengths of the word transistors WT smaller, the problem of punch through hardly arises.

Further, in the present embodiment, a variety of modifications can be made within the scope of the technical concept of the present invention.

For example, the auxiliary layer for formation of the control gates is not limited to polycrystalline silicon and can be comprised of amorphous silicon or other conductors or can be comprised of a dielectric. In this case, it is necessary to form the source/drain regions by burying under the dielectric isolation layers ISO or to provide the dielectric isolation layers ISO up to the two sides of the storages and to cut them on the source/drain regions S/D. As a result, the source/drain regions S/D are formed in line shapes long in the column direction, and the source/drain regions S/D are used as bit lines.

Figure 8:
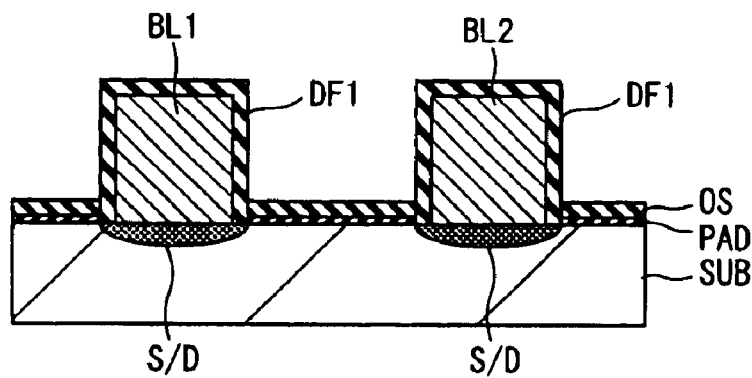
FIG. 8 is a sectional view after thermal oxidation of surfaces of the bit lines in production of a memory cell to the embodiment.
Figure 9:
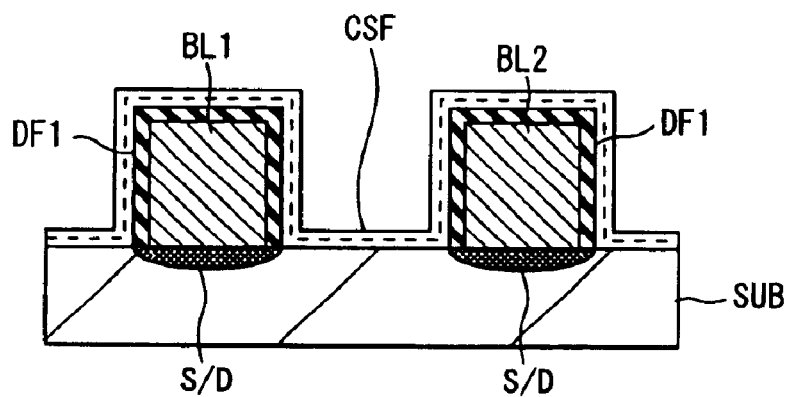
FIG. 9 is a sectional view after forming a charge storage film in production of a memory cell to the embodiment.
Figure 10:
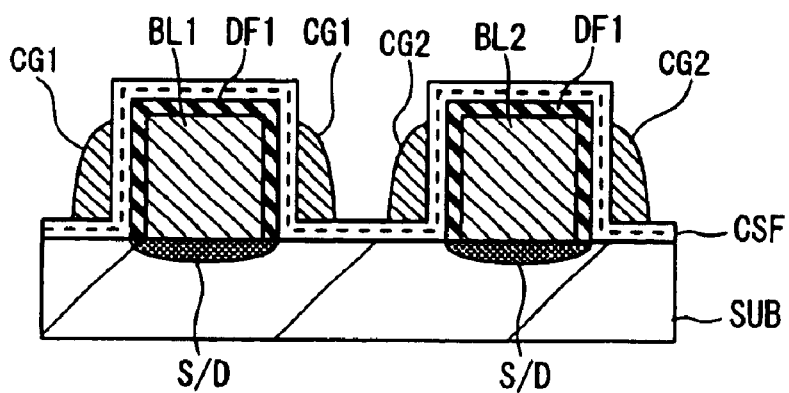
FIG. 10 is a sectional view after forming control gates in production of a memory cell to the embodiment.
Figure 11:
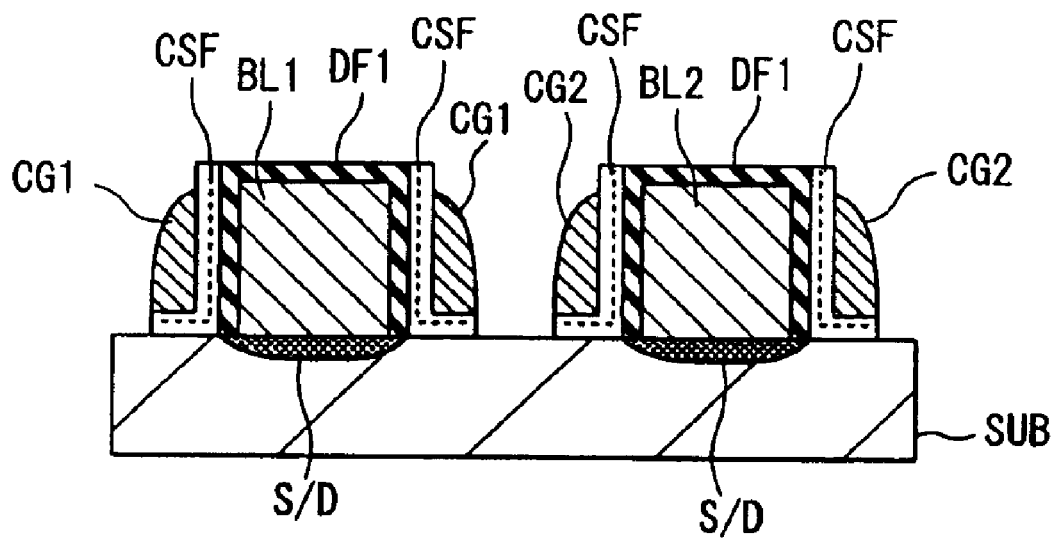
FIG. 11 is a sectional view after removing parts of the charge storage film by using the control gates as a mask in production of a memory cell to the embodiment.

Further, it is also possible not to form the dielectric film DF1 by thermal oxidation on the surface of the polycrystalline silicon in the step of FIG. 8, but to form the charge storage film CSF in the step of FIG. 9. In this case, in the step of FIG. 11, the upper surfaces of the polycrystalline silicon for forming the bit lines BL1, BL2, . . . are exposed by etching the charge storage film CSF, but when thermally oxidizing the surfaces of the control gates CG1, CG2, . . . after that, the upper surfaces of the polycrystalline silicon for forming the bit lines are also thermally oxidized and silicon dioxide films are formed. Thus, the insulation isolation film for word lines can be sufficiently formed. In this method, the step of forming the pad layers PAD and the oxidation stop OS in FIG. 5, the step of later removal, and the step of thermal oxidation in FIG. 8 are unnecessary, so there is an advantage that the process can be simplified by that amount.

Figure 14:
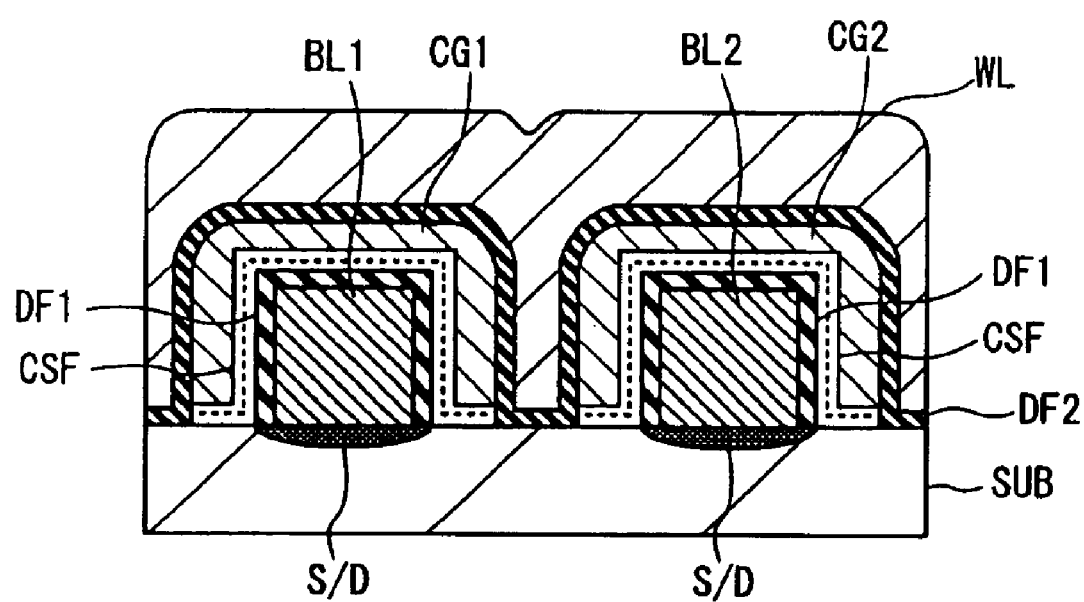
FIG. 14 is a sectional view along a line A—A in FIG. 1A illustrating a modification of the shapes of the control gates of the embodiment.

Furthermore, the shapes of the control gates CG1, CG2, . . . are not limited to the sidewall shapes formed on the sides of the auxiliary layers (the bit lines BL1, BL2, . . . in the above explanation) comprised of a conductor or dielectric. For example, as shown in FIG. 14, the control gates CG1, CG2, . . . may be made shapes covering the sides and upper surfaces of the bit lines BL1, BL2, . . . as shown in FIG. 14. Note that the shapes are limited to applications using the control gates belonging to different cells straddling the bit lines by electrically the same potential.

Further, in this configuration, the charge storage films CSF inevitably are shaped to cover the sides and upper surfaces of the bit lines BL0, BL2 . . . . This is because in the step of isolating the charge storage films CSF of FIG. 11 explained above, the portions of the charge storage films on the bit lines are protected by the control gates CG1, CG2, . . .

Below, two examples of a method of forming the control gates CG1, CG2, . . . will be explained with reference to the drawings.

Figure 15:
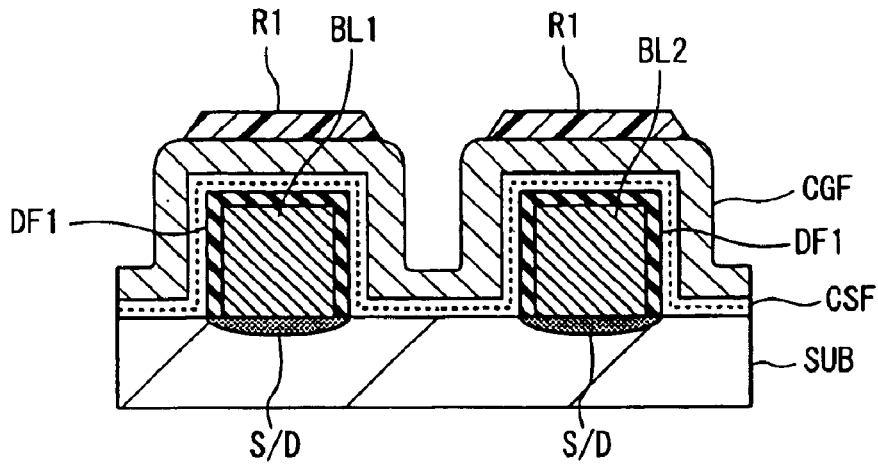
FIG. 15 is a sectional view after formation of resist patterns relating to a first method of forming control gates of the modification.
Figure 16:
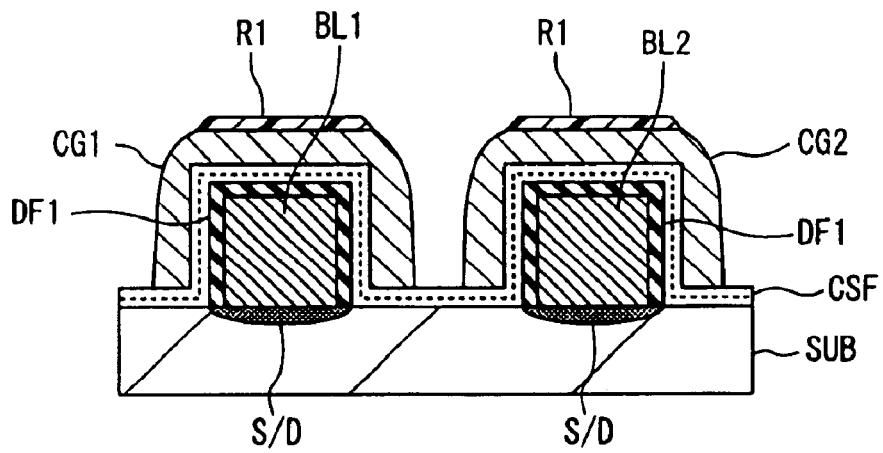
FIG. 16 is a sectional view after etching of control gates relating to a first method of forming control gates of the modification.
Figure 17:
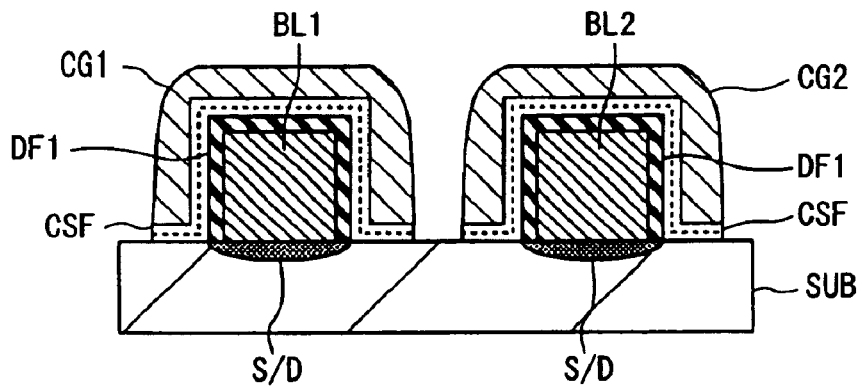
FIG. 17 is a sectional view after etching of the charge storage film relating to a first method of forming control gates of the modification.

The first method is shown in FIG. 15 to FIG. 17. This production method can be carried out by replacing the step of forming sidewall type control gates shown in FIG. 10 explained above by the steps shown in FIG. 15 and FIG. 16.

After forming the bit lines BL1, BL2, the source/drain regions S/D, the dielectric DF1, and the charge storage film CSF by the same steps as in FIG. 5 to FIG. 9, as shown in FIG. 15, a conductive film CGF comprised for example of polycrystalline silicon or amorphous silicon is formed on the entire surface. Further, the portions of the conductive film CGF positioned on the bit lines BL1 and BL2 have formed over them resist patterns R1 by photolithography.

The conductive film CGF is patterned by etching using the resist patterns R1 as a mask. Due to this, as shown in FIG. 16, control gates CG1 and CG2 isolated at the upper portion of the center of the channel formation region are formed.

The etching at this time is desired to be performed under conditions of a suitably strong anisotropy and recessing the resist patterns R1 a little. Along with the reduction of thickness of the resist patterns R1 during the etching, the edges of the resist patterns R1 recess and as a result the main regions of the side surfaces of the control gates CG1 and CG2 become forward tapered. Note that the edges of the resist patterns R1 may be rounded in advance for example by post-baking at a relatively high temperature to make recessing of the edges easier.

As shown in FIG. 17, the charge storage film CSF is separated by etching using as a mask the control gates CG1 and CG2. Further, to obtain the structure of FIG. 14, the dielectric films DF2 and word line WL are formed by the same method as explained above to complete the basic structure of the memory cell.

The second method is a method of forming a mask layer at the time of processing the conductive film CGF by self-alignment with the shape of the base. The second method is shown in FIG. 18 to FIG. 22. The production method can be carried out by replacing the step of forming sidewall type control gates shown in FIG. 10 explained above by the steps shown in FIG. 18 to FIG. 22.

Figure 18:
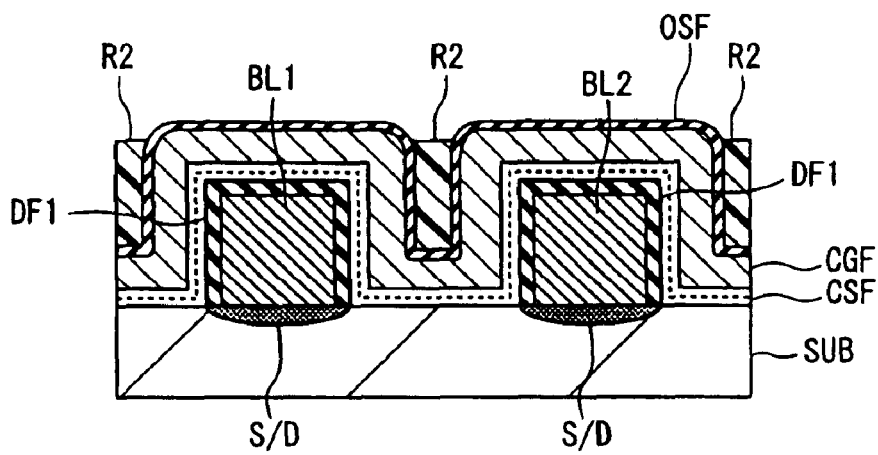
FIG. 18 is a sectional view after burying of a resist relating to a second method of forming control gates of the modification.

After forming the bit lines BL1, BL2, source/drain regions S/D, dielectric DF1, and charge storage film CSF by the same steps as those shown in FIG. 5 to FIG. 9, as shown in FIG. 18, a conductive film CGF comprised for example of polycrystalline silicon or amorphous silicon is formed over the entire surface. Next, an oxidation stop film OSF comprised for example of silicon nitride is thinly formed over the surface of the conductive film CGF. Further, a resist is coated, baked, then etched back to bury recessed portions on the surface with a resist R2.

Figure 19:
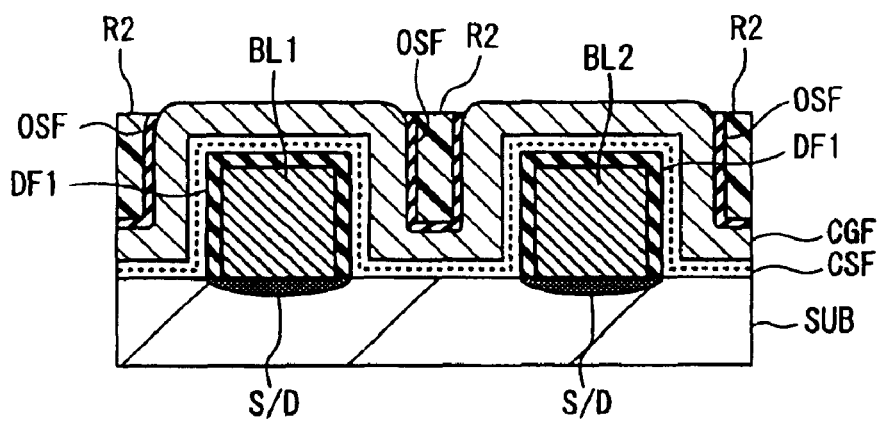
FIG. 19 is a sectional view after removing parts of an oxidation stop film relating to a second method of forming control gates of the modification.

By etching in this state using the resist R2 as a mask, as shown in FIG. 19, the parts of the oxidation stop film OSF positioned above the bit lines BL1 and BL2 are removed.

Figure 20:
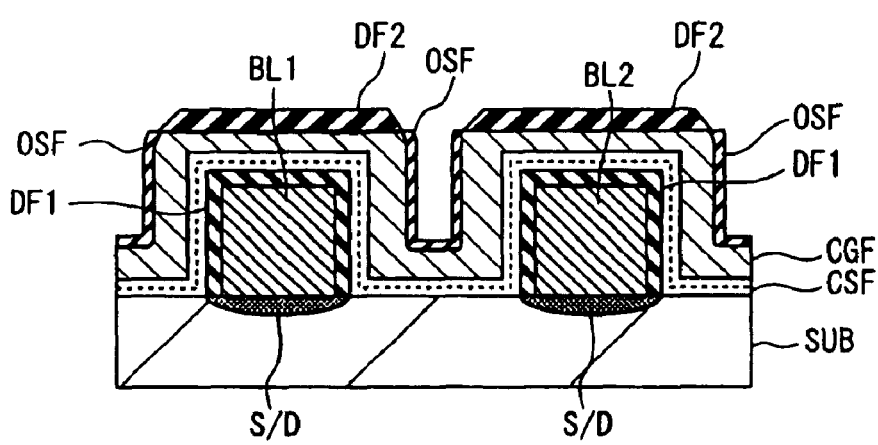
FIG. 20 is a sectional view after formation of a dielectric film relating to a second method of forming control gates of the modification.

The resist R2 is removed, then the conductive film CGF exposed around the oxidation stop film OSF is selectively thermally oxidized to form dielectric films DF2 above the bit lines BL1 and BL2 as shown in FIG. 20.

Figure 21:
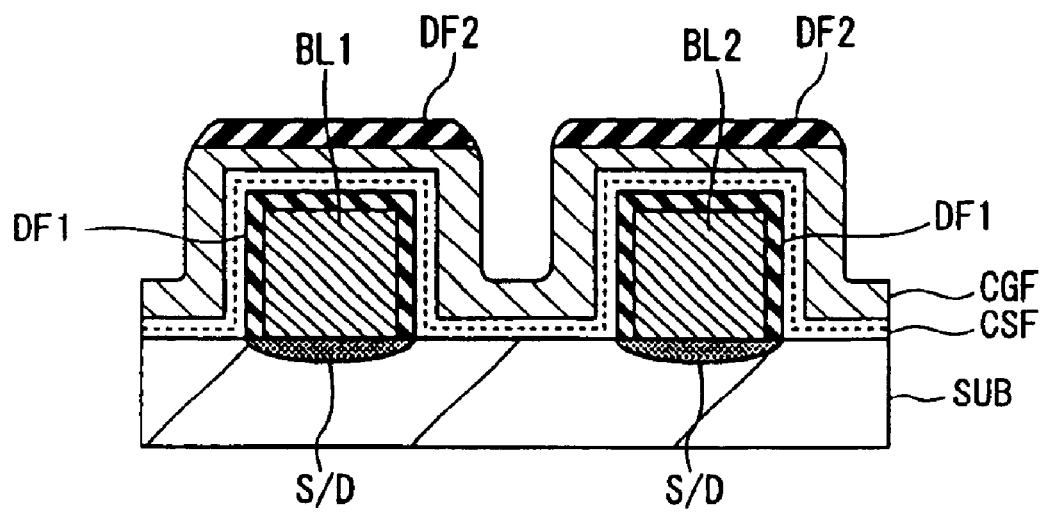
FIG. 21 is a sectional view after removal of the remaining oxidation stop film relating to a second method of forming control gates of the modification.

As shown in FIG. 21, the oxidation stop film OSF is removed.

Figure 22:
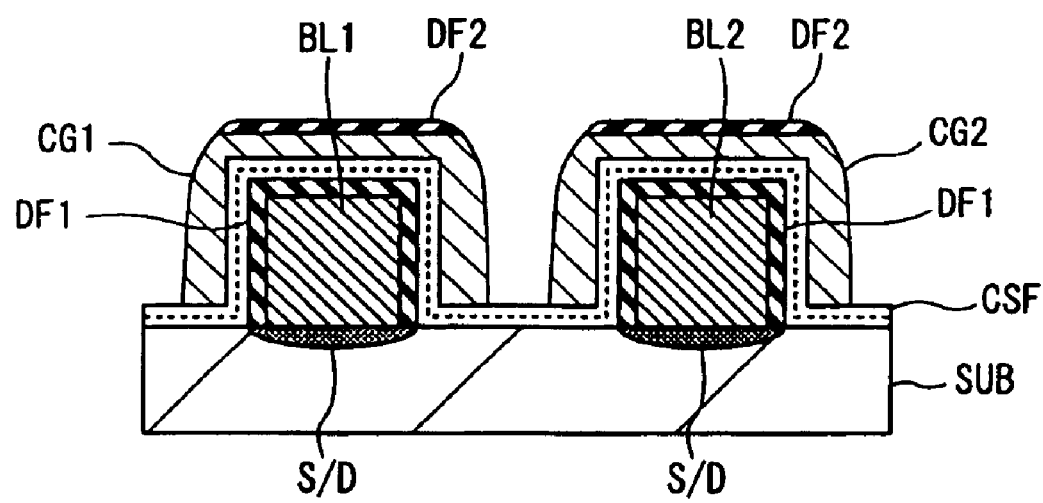
FIG. 22 is a sectional view after etching of the control gates relating to a second method of forming control gates of the modification.

The conductive film CGF is patterned by etching using the dielectric films DF2 as a mask. As a result, as shown in FIG. 22, control gates CG1 and CG2 separated at the upper portion of the center of the channel formation region are formed.

The etching at this time is desired to be performed under conditions of suitably strong anisotropy and recessing the dielectric films DF2 a little. Since the dielectric films DF2 are formed by selective oxidation using the oxidation stop film OSF, at each edge, the closer to the front end, the thinner the thickness in the same way as a so-called bird's beak in LOCOS. Accordingly, along with the reduction of thickness of the dielectric films DF2 during the etching of the control gates, the edges of the dielectric films DF2 recess. As a result, the main regions of the side surfaces of the control gates CG1 and CG2 become forward tapered.

Next, etching is performed using the control gates CG1 and CG2 as a mask to separate the charge storage film CHS. Further, to obtain the structure of FIG. 14, dielectric films DF2 are formed on the sides of the control gates CG1 and CG2 and word line WL is formed by the same method as explained above so as to complete the basic structure of the memory cell.

According to the non-volatile semiconductor memory device and method of producing the same according to the present invention, the step of connecting word gate electrodes and a word line as in the prior art is unnecessary, and residue of a conductive material causing short-circuit between second control electrodes is not produced.

Even when uncontrollable charges continuously accumulate in nearby regions outside the storages in a direction along the first control electrodes, the presence of the dielectric isolation layers results in the effect of the charges on the channel being remarkably weakened and, as a result, the leak characteristic does not decline even when repeatedly rewriting.

The two first control electrodes in one memory cell are already isolated at the time of being formed, so the process of separating them for independent control becomes unnecessary.

When the auxiliary layer is comprised of a conductive material, the resistances of the bit lines are remarkably reduced compared with a case of configuring the bit lines by just impurity regions buried in the semiconductor. Further, when the first control electrodes are shaped to covering the sides and upper surfaces of the auxiliary layer, the resistances of the first control electrodes were reduced compared with sidewall shapes.

Furthermore, even when widths of lines and spaces of the second control electrodes are formed by the minimum limit of lithography, the leakage current is not increased and the channel width is not reduced as a result of misalignment of the second control electrodes. As a result, the S/N ratio of a read signal does not decline.

What is claimed is:

1. A method of producing a non-volatile semiconductor memory device comprising a channel formation region comprised of a first conductivity type semiconductor, two impurity regions separated from each other across said channel formation region and comprised of a second conductivity type semiconductor, two first control electrodes formed on two ends of said channel formation region close to said two impurity regions in a state with charge storage films, each comprised of a plurality of dielectric films, interposed, and a second control electrode facing said channel formation region between the first control electrodes in a state with a single-layer dielectric film interposed and arranged long in the direction of separation of said impurity regions, said method of producing a non-volatile semiconductor memory device including the following steps, forming auxiliary layers in line shapes long in a direction orthogonal to a direction of separation of said impurity regions on said impurity regions or semiconductor regions where said impurity regions are to be formed;

forming said charge storage film on surfaces of said auxiliary layers and a surface of said channel formation region;

forming said first control electrodes along said auxiliary layers in a state with said charge storage film interposed;

removing part of the charge storage film by etching using said first control electrodes as a mask;

forming a single-layer dielectric film on a surface of said channel formation region exposed by the removal of said charge storage film and surfaces of said first control electrodes; and forming said second control electrodes on said single-layer dielectric film and said auxiliary layers.

2. A method of producing a non-volatile semiconductor memory device as set forth in claim 1, wherein said auxiliary layers comprise dielectric layers.

3. A method of producing a non-volatile semiconductor memory device as set forth in claim 1, wherein said auxiliary layers comprise conductive layers.

4. A method of producing a non-volatile semiconductor memory device as set forth in claim 3, wherein said auxiliary layers comprise polycrystalline silicon or amorphous silicon doped with a second conductivity type impurity.

5. A method of producing a non-volatile semiconductor memory device as set forth in claim 4, further including a step of forming said second conductivity type impurity regions by solid-state diffusion using said auxiliary layers as diffusion sources.

6. A method of producing a non-volatile semiconductor memory device as set forth in claim 4, further including a step of selectively thermally oxidizing the surfaces of polycrystalline silicon or amorphous silicon comprising said auxiliary layers so as to insulate between said second control electrodes and said auxiliary layers.

7. A method of producing a non-volatile semiconductor memory device as set forth in claim 6, wherein the step of forming said auxiliary layers includes the following steps, stacking a pad oxide film, a nitride film, and a sacrificial film in that order to form a stacked film;

removing parts of said stacked film by etching;

burying portions where said stacked film is removed with polycrystalline silicon or amorphous silicon doped with a second conductivity type impurity to form said auxiliary layers;

removing said sacrificial layer; and thermally oxidizing surfaces of said polycrystalline silicon or amorphous silicon by using said nitride film as an oxidation stop film.

8. A method of producing a non-volatile semiconductor memory device as set forth in claim 7, comprising, when thermally oxidizing the surfaces of said polycrystalline silicon or amorphous silicon, forming said impurity regions of a second conductivity type by solid-state diffusion using said polycrystalline silicon or amorphous silicon as a diffusion source.

9. A method of producing a non-volatile semiconductor memory device as set forth in claim 7, wherein the step of forming said auxiliary layers further comprises the following steps, forming openings in said stacked film by patterns of said auxiliary layers;

doping a second conductivity type impurity through said openings to form said impurity regions of the second conductivity type in semiconductor regions exposed at bottom surfaces of said openings; and burying said openings with polycrystalline silicon or amorphous silicon doped with impurities.

10. A method of producing a non-volatile semiconductor memory device as set forth in claim 1, wherein the step of forming said first control electrodes forms first control electrodes of sidewall shapes at the two sides in the width direction of said auxiliary layers by depositing and etching back a conductive film.

11. A method of producing a non-volatile semiconductor memory device as set forth in claim 1, wherein said step of forming the first control electrodes further includes the steps of:

depositing a conductive film;

forming an etching protective layer on the conductive film positioned above said auxiliary layers; and etching said conductive film while protecting the upper portions of said auxiliary layers by the etching protective layer to separate said conductive film at a portion positioned above the center portion of said channel formation region.

12. A method of producing a non-volatile semiconductor memory device as set forth in claim 11, wherein said step of forming said etching protective layer further includes the steps of:

forming an oxidation stop film on inner walls of a recess in said conductive film formed reflecting the shapes of said auxiliary layers;

thermally oxidizing surfaces of portions of the conductive film positioned above said auxiliary layers not covered with the oxidation stop film to form said etching protective layer; and removing said oxidation stop film.

13. A method of producing a non-volatile semiconductor memory device as set forth in claim 1, further including the steps of:

forming dielectric isolation layers in parallel line shapes long in one direction and forming auxiliary layers comprised of polycrystalline silicon or amorphous silicon doped with a second conductivity type impurity in parallel line shapes long in a direction orthogonal to said dielectric isolation layers, and forming said impurity regions of the second conductivity type at semiconductor locations overlapping regions of arrangement of said auxiliary layers between said dielectric isolation layers.

14. A method of producing a non-volatile semiconductor memory device as set forth in claim 1, wherein the step of forming said first control electrode includes the following steps, depositing a conductive film for forming said first conductive electrodes;

forming an etching protective layer on portions of the conductive film for of said first control electrodes; and etching back said conductive film.

* * * * *